United States Patent [19]

Tanaka et al.

[11] Patent Number: 5,328,807
[45] Date of Patent: Jul. 12, 1994

[54] METHOD OF FORMING A PATTERN

[75] Inventors: Toshihiko Tanaka; Norio Hasegawa, both of Tokyo; Toshiaki Yamanaka, Iruma; Akira Imai, Kokubunji; Hiroshi Shiraishi; Takumi Ueno, both of Hachiohji; Hiroshi Fukuda, Kokubunji, all of Japan

[73] Assignee: Hitichi, Ltd., Tokyo, Japan

[21] Appl. No.: 711,954

[22] Filed: Jun. 7, 1991

[30] Foreign Application Priority Data

Jun. 11, 1990 [JP] Japan .................. 2-149998
Sep. 12, 1990 [JP] Japan .................. 2-239825

[51] Int. Cl.$^5$ .......................... G03C 5/00; G03F 9/00
[52] U.S. Cl. .................................. 430/311; 430/5; 430/396
[58] Field of Search .............. 430/5, 311, 312, 394, 430/396

[56] References Cited

U.S. PATENT DOCUMENTS

| | | | |
|---|---|---|---|
| 4,665,006 | 5/1987 | Sachdev | 430/323 |
| 4,775,609 | 10/1988 | McFarland | 430/325 |
| 4,912,018 | 3/1990 | Osuch | 430/325 |
| 5,045,417 | 9/1991 | Okamoto | 430/396 |
| 5,091,979 | 2/1992 | White | 385/3 |
| 5,122,852 | 6/1992 | Chan | 385/15 |

FOREIGN PATENT DOCUMENTS

0293643 12/1988 European Pat. Off. .

Primary Examiner—Marion E. McCamish
Assistant Examiner—Kathleen Duda
Attorney, Agent, or Firm—Antonelli, Terry, Stout & Kraus

[57] ABSTRACT

A comb-like or dot-like phase shifter pattern is added to a phase shifter used in phase shifting mask technology, which is then exposed onto a wafer. This enables the formation of extremely fine line patterns or space patterns having widths different from each other simultaneously. Further, when two reticles are disposed such that phase shifter patterns disposed therein intersect each other and are exposed consecutively onto a wafer, a fine hole pattern or dot pattern can be formed at a position where the phase shifter patterns intersect each other.

16 Claims, 4 Drawing Sheets

METHOD OF FORMING A PATTERN

BACKGROUND OF THE INVENTION

The present invention concerns a method of forming a pattern and, more in particular, it relates to a method of forming a fine pattern suitable for the production of semiconductor devices, magnetic bubble memories, superconductivity devices and surface acoustic wave devices.

In a projection printing system of irradiating a light by way of a mask having a pattern to be formed (hereinafter referred to as a reticle) and transferring the pattern on the reticle to a photoresist film formed on a wafer, it has been demanded to make the pattern formed on the photoresist film finer. As a measure for indicating the performance of the projection printing system as to the capability of forming a fine pattern, "resolution" has been used generally. The resolution is expressed by a minimum distance between two adjacent points or lines that can allow them to be separated from each other and the resolution of existent reduction projection printing systems is about 0.5 $\mu$m.

As a means for improving the resolution, it has been known to provide exposure light passing through two adjacent permeable portions of a reticle with a phase shift. A reticle pattern used for providing the exposure light with the phase shift is described in, for example, Japanese Patent Laid-Open Hei 2-078216. In this case, a transparent thin film for changing the phase oft transmission light by 180° is used as a phase shifter, which is disposed at a portion of the permeable portion of the reticle. Since the presence/absence of the shifter causes a 180° phase shift to the transmission light, a complete dark portion is formed along the rim of the shifter and the line width of the dark portion is extremely fine. Accordingly, an extremely fine line pattern can be formed if a positive type resist is used and an extremely fine space pattern can be formed if a negative type resist is used.

However, the above-mentioned prior art involves a problem in that patterns having various line widths can not be formed simultaneously although an extremely fine pattern can be formed. For instance, a space pattern of 0.2 $\mu$m width can be formed by using the prior art described above, but it is not possible to form a space pattern, for example, of 0.2 $\mu$m width, together with a space pattern of 0.3 $\mu$m width or 0.35 $\mu$m width. If the phase shifting mask technology of the prior art is combined with usual method of using a Cr film as a mask, it is possible to form, for example, a space pattern off 0.2 $\mu$m width by the phase shifting mask technology and a pattern of greater than 0.5 $\mu$m width by a usual exposing method using the Cr film respectively, but a pattern of a width between 0.2 to 0.5 $\mu$m can not be obtained. In addition, there is a problem that the pattern that can be formed by the foregoing prior art is restricted to space patterns or line patterns and this method is not effective for the formation of dot patterns or hole patterns.

SUMMARY OF THE INVENTION

An object of the present invention is to overcome the foregoing problems in the prior art and provide a method of forming a pattern capable of forming an extremely fine pattern at a high accuracy.

Another object of the present invention is to overcome the foregoing problems of the conventional phase shifting mask technology in the prior art and provide a method capable of forming patterns having various line widths simultaneously.

A further object of the present invention is to provide a method of forming a pattern capable of forming not only a line pattern or a space pattern but also a fine dot pattern or a hole pattern by means of phase shifting mask technology.

For attaining the foregoing object, according to the present invention, a fine phase shifter pattern having a size less than the resolution limit of a projection printing system used is disposed at or near the rim of a phase shifter formed in a reticle and a photoresist film is expressed by way of the reticle.

Figure 1A:
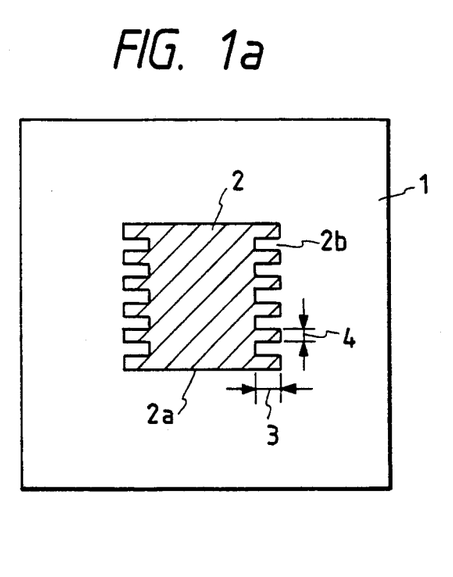
FIGS. 1a and 1b are views illustrating an embodiment of the present invention for forming a line pattern or a space pattern.
Figure 2A:
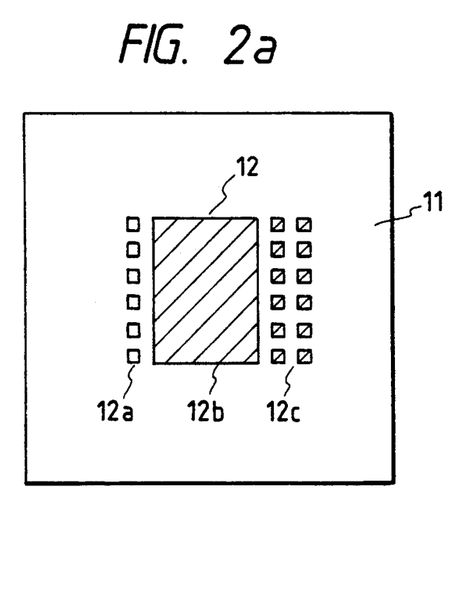
FIGS. 2a and 2b are views illustrating another embodiment of the present invention for forming a line pattern or a space pattern.

As a phase shift pattern, the rim of a phase shifter 2 may be formed into a comb-like shape as shown, for example, in FIG. 1a and the comb-like portion may be used as a phase shift pattern, or dot-like additional patterns 12a, 12c may be disposed near the rim of a phase shifter 12b, for example, as shown in FIG. 2a, and they may be used as phase shifter patterns.

When a light is applied to such a phase shifter pattern, since the size of the phase shifter pattern is less than the resolution limit of the projection printing system used, the incident light is remarkably diffracted to diverge out of a lens and is not focussed on a photoresist film, thereby forming a dark portion. Since the phase of the light transmitting the phase shifter is changed by 180°, lights with the phase difference of 180° are offset to each other at the rim of the phase shifter to form a dark portion. In the present invention, since the rim of the phase shifter is formed not linearly but in a comb-like shape, the width of the dark portion can be controlled to a desired value by varying the length of each protrusion in the comb-like portion, that is, the tooth length of a comb. Accordingly, a space pattern having a desired width is formed in a case of using a negative type photoresist, while a line pattern having a desired width is formed in a case of using a positive type photoresist, respectively.

The situation is similar in a case of disposing a dot-like additional pattern as a phase shifter pattern near the rim of the phase shifter and the incident light is remarkably diffracted by the fine additional pattern to form a dark portion. In this case, the width of the dark portion can be controlled to a desired value in accordance with the size of each dot-like additional pattern and the distance between each of the additional patterns.

FIG. 1a shows an example in which comb-like portions each of equal length 3 are formed on both rims of the phase shifter 2, but if comb-like portions having length 3 different from each other are formed on the rightward rim and the leftward rim respectively, two line patterns or space patterns of width different from each other can be formed. The situation is the same also in a case of using dot-like additional patterns.

In a case of forming a hole pattern or a dot pattern, at least two reticles each formed with a phase shifter are used and exposure is conducted with each of the reticles respectively. Each of the reticles is exposed, being disposed such that the phase shifter patterns intersect each other. The hole pattern or the dot pattern may be formed by conducting exposure with each of the reticles being disposed such that not the phase shifter patterns but the linear rims of the respective phase shifters intersect each other. However, if the phase shift patterns are adapted to intersect each other, the diameter or the size of the dot pattern or the hole pattern can be controlled with ease in the same manner as in the case of forming the line pattern or the space pattern described above.

In a case of forming the dot pattern or the hole pattern, a first exposure is conducted at first by using a first reticle and a second exposure is conducted next by using a second reticle. In this case, a phase shifter pattern possessed by the first reticle and the phase shifter pattern possessed by the second reticle are disposed so as to intersect each other at a place to form the hole pattern or the dot pattern.

A light does not reach a position on a photoresist film corresponding to a phase shifter pattern due to the diffraction of the light as described above, so that a dark portion is formed. However, since portions other than the place where the first and the second phase shifter patterns intersect are exposed to the light by either one of the first exposure and the second exposure, it does not form a dark portion but only the place where both of the patterns intersect is left as a dark portion in which the intensity of light is zero, to form a hole pattern or a dot pattern. If the first exposure and the second exposure are applied in the same manner while intersecting the linear rims of the first and the second phase shifters, since the phase of light changes by 180° at the rims of the phase shifter, it is also possible to form a hole pattern or a dot pattern. In this case, however, it is difficult to control the diameter or the size of the dot pattern or the hole pattern like that in the line pattern or the space pattern. The photoresist is removed at a portion where the dark portions intersect to form a hole pattern when the negative type photoresist is used, while the portion where the dark portions intersect is left to form a dot pattern when a positive type photoresist is used.

In this specification, "less than the resolution limit" referred to above represents a size on the photoresist film, and the size on the reticle is greater than that. For instance, in a case of using a projection printing system, having a resolution limit, that is, a resolution of 0.5 μm and a reduction rate of 5, for example, the size of a phase shifter pattern on a reticle may be set five times 0.5 μm, that is, less than 2.5 μm. In other words, if the size on the reticle is less than 2.5 μm, the size on the photoresist film is less than 0.5 μm, which can not be resolved.

In a case of using a phase shifter pattern having a shape shown in FIG. 1a, the width 4 For each of the protrusions and the gap between each of the protrusions in the comb-like portion Formed on the side of the phase shifter 2 may be set to less than the resolution limit as described above (less than 2.5 μm in the example described above), and the length 3 for each of the protrusions may be selected properly corresponding to the width of the line pattern or the space pattern to be formed.

It is preferred that corresponding portions in each of the protrusions are parallel with each other as shown in FIG. 1a. A pattern in which they are inclined slightly and thus deviated somewhat from the parallel relation may also be used but a shape like that of saw teeth is not desirable.

Further, in a case of forming a phase shifter pattern with a plurality of dot-like patterns as shown in FIG. 2a, the size For each of the dot-like patterns and the distance between each of the dot-like patterns may be set to less than the resolution limit, that is, less than 2.5 μm in the example described above. Various shapes may be used for each of the dot-like patterns, and it is desirable for such a shape that the width of the space between each of the dot-like patterns is constant. Therefore, a rectangular or triangular shape is preferred but a circular shape is not desired.

In the present invention, it is only necessary that a phase shifter pattern be formed by making the shape of the phase shifter film different from that in the prior art and an opaque layer made of a Cr film or the like is not required. In the existing phase shifting mask technology using both of the opaque layer and the phase shifter, there is a problem such as causing a deviation in the position of the phase shifter film and the opaque layer, but the present invention is free from such a problem since the opaque layer is not used.

However, a reticle sometimes requiring a mark for aligning the reticle with a projection printing system or a mark for aligning the reticle with a wafer and, in such a case, the opaque pattern may be required depending on the alignment detection optical system.

DETAILED DESCRIPTION OF THE PREFERRED EMBODIMENTS

Example 1

Exposure was applied by using a reticle comprising a phase shifter layer 2 disposed on a glass substrate 1 as shown in FIG. 1a. As the phase shifter 2, an $SiO_2$ film formed by a well-known sputtering method was used. The material is not restricted only to the $SiO_2$ film but there can be used any other film comprising material highly transparent to exposure light, For example, SOG (spin on glass) film, ITO (indium tin oxide) film, silicon nitride film and polyimide film. The layer thickness of the phase shifter is set such that the phase of the exposure light passing through the shifter changes by 180° relative to the exposure light passing through the glass surface. The resolution is deteriorated as the phase is shifted from 180°, but it has been found that the deterioration of the size is less than 10% and it can be put to practical use if the amount of shift is within ±10°, As shown in FIG. 1a, a portion 2a at the rim of the phase shifter 2 was made linear, while other portions 2b were made into a comb-like shape. The protrusion of the comb-like portion had a height 3 of 2 μm and a width 4 of 1 μm. For the exposure system, a reduction projection printing system having a numerical aperture of a lens (hereinafter simply referred to as NA) of 0.42 and using an i-line (365 nm in wavelength) was used. The reduction rate was 1/10.

Consequently, each of the protrusions in the comb-like portion was 0.2 μm in height and 0.1 μm in width on a photoresist film. Since the resolution limit of the exposure system is from 0.35 μm to 0.4 mm and, therefore, 0.1 μm of width is less than the resolution limit, and the protrusions formed on the reticle are not resolved on the photoresist films.

Figure 1B:
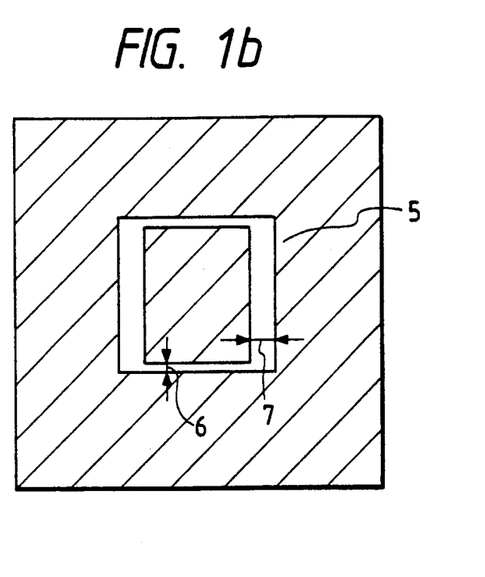

A negative type photoresist film formed on a silicon wafer was exposed by way of the reticle and then developed. As a result, a resist pattern 5 as shown in FIG. 1b having a portion corresponding to the rim of the phase shifter pattern forms as a space was obtained. A space width 6 at a portion corresponding to the linear portion 2a on the rim of the phase shifter 2 was about 0.2 μm, and the space width 7 at a portion corresponding to the comb-like portion 2b thereof was about 0.3 μm. The space width 7 changed depending on the length of the protrusion in the comb-like portion. For instance, if the length of the protrusion in the reticle was 3 μm, the space width 7 was about 0.4 μm. It is only necessary that the width 4 of the protrusion is not restricted to the above-mentioned value in this example, so long as it is sufficiently smaller than the resolution limit of the lens. For instance, if it is 0.5 μm in the reticle, a similar result was also obtainable.

Further, although this example shows a case in which an NA for the lens was 0.42 and an i-line were used for the exposure light, they are not restrictive. However, the line width depends on NA and the wavelength of the exposure light and the line width becomes finer as the NA is greater and the wavelength is shorter. Further, the line width also depends on the coherency value σ of an illumination system. As the value σ becomes smaller, the line width is narrower.

In this example, the width of the space 6 can be changed by Forming the comb-like phase shifter pattern 2b in the linear portion 2a on the rim of the phase shifter 2, and the width of the space 6 can be controlled to a desired value by changing the height 3 of the protrusion or the width 4 of the protrusion in the comb-like portion. Further, in this example, comb-like portions having the height 3 and the width 4 equal to each other were disposed on both right and left rims of the phase shifter 2 to thereby form the spaces 7 having width equal to each other on the right and left as shown in FIG. 1b. However, spaces 7 having widths different from each other may be formed by forming comb-like portions having the length 3 and the width 4 different from each other on the right and left rims of the phase shifter 2. In this way, four kinds of spaces having widths different from each other can be formed simultaneously, by forming comb-like portions having length and width different from each other, respectively, on upper and lower and right and left rims of the phase shifter 2.

Example 2

In this example, a reticle comprising a phase shifter 12 formed on a glass substrate 11 as shown in FIG. 2a was used. The phase shifter 12 comprised a square additional shifter pattern 12a of 1 μm □ on the reticle, a shifter main body 12b and a square additional shifter pattern 12c. In this embodiment, shifters disposed in one row and in two rows were used as the square additional shifter patterns 12a and 12c respectively. The space between the rows in the additional shifter pattern 12c was set to 1 μm on the reticle. The minimum pattern size of the projection printing system used herein was the same as that used in Example 1 and the size of 1 μm on the reticle is sufficiently smaller than the minimum pattern size.

Figure 2B:
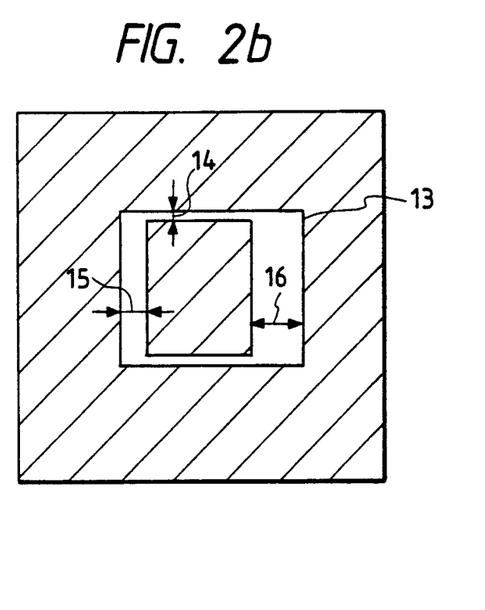

A negative photoresist film formed on a silicon wafer was exposed by way of the reticle and then the photoresist film was developed. As a result, a resist pattern 13 shown in FIG. 2b was obtained. In this case, the space width for the resist pattern was different depending on the absence or the presence of the additional shifter and it was about 0.2 μm at a place 14, about 0.3 μm at a place 15 and about 0.5 μm at a place 16. In this example, the size of the square additional shifter was set to 1 μm on the reticle but it is not restricted only thereto so long as the size is sufficiently smaller than the minimum pattern size and it may be 0.5 μm for instance. Further, the shape is not always restricted to the square shape but other shapes, for example, a rectangular, circular or triangular shape may also be used.

In this embodiment, the line width can be controlled in accordance with the size of the region occupied by the square additional shift patterns 12a and 12c. Accordingly, the line width can be controlled more finely as the size of each of the square additional shifters is smaller. On the other hand, as the size of the square additional shifter is smaller, the required number of the shifters is increased. This means that a time for forming the reticle by drawing the additional shifter with an electron beam exposure system is increased. The size of the square additional shifter is properly determined while taking both of these factors into consideration. In this example, since the width for the space can be controlled to a desired value by changing the size of each of the square additional shifters, even if the size of the additional shifter pattern is constant, design for the reticle pattern is easy.

Example 3

Figure 3A:
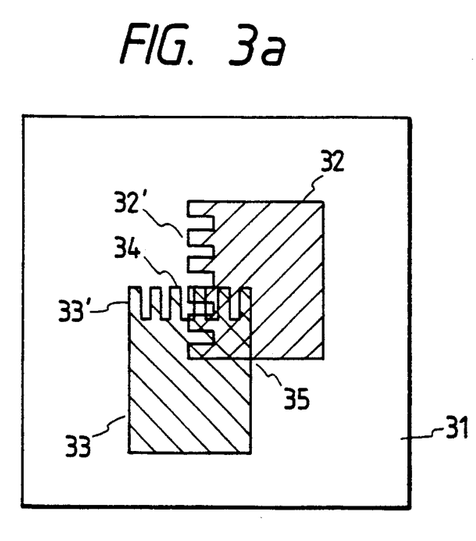
FIGS. 3a and 3b are views illustrating an embodiment of the present invention for forming a hole pattern or a dot pattern.
Figure 3B:
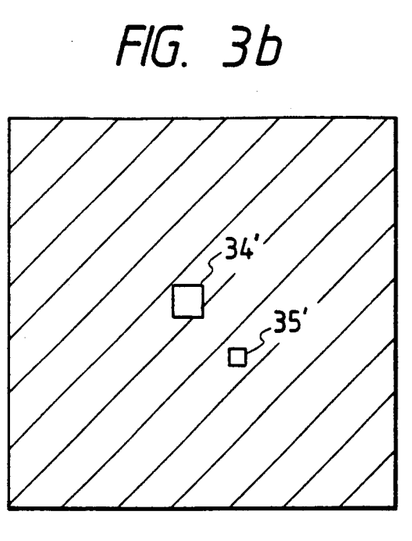

Using a reticle comprising a phase shifter 32 disposed a glass substrate 31 as shown in FIG. 3a, a first exposure was conducted. The exposure system, the wafer, the exposure conditions, etc. were the same as those in Example 4 to be described later. The reduction rate of the exposure system was 1/10. As shown in FIG. 3a, one rim 32' on the first phase shifter 32 was made into a comb-like shape. Each of the protrusions in the comb-like portion had a height of 2 μm and a width of 1 μm on the reticle. Then, a second exposure was conducted by using a second reticle comprising a second phase shifter 33 disposed on the glass substrate 31. Also in this second phase shifter 33, one rim 33' was made into a comb-like shape like that in the first phase shifter 32. The comb had a length of 2 μm and a width of 1 μm on the reticle. By developing the exposed wafer, hole patterns 34' and 35' were Formed at places of a photoresist film corresponding to intersections 34 and 35 of the phase shifters 32 and 33, respectively. The diameter of the hole pattern 34' was about 0.3 μand the diameter For the hole pattern 35' was about 0.2 μm. Then, an extremely fine hole pattern (0.2 μm) could be Formed and hole patterns of different sizes could be formed as well by making the rim of the phase shifter into a comb-like shape.

The diameter of the hole can of course be controlled by changing the height for each of the protrusions of the comb-like portion formed on the rim of the shifter. It will also be apparent that a rectangular or elliptic hole can be obtained by varying the height For each of the protrusions in the comb-like portion between the shifters 32 and 33 relative to each other. Further, in addition to forming the rim of the shifter into the comb-like shape, a dot-like additional phase shifter as shown in Example 2 may also be used.

Example 4

Figure 4A:
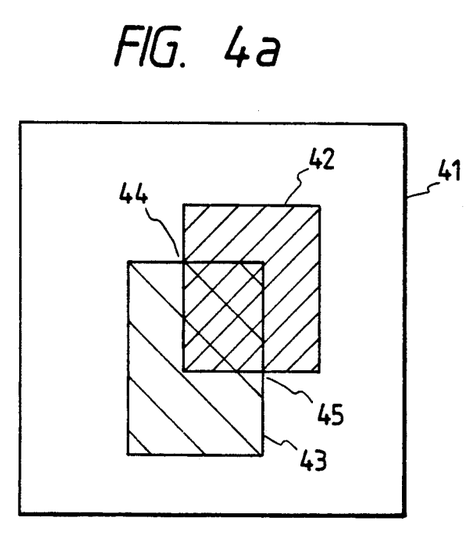
FIGS. 4a and 4b, 5a and 5b, 6a and 6b and 7a and 7b are views illustrating, respectively, different embodiments for forming hole patterns or dot patterns.
Figure 4B:
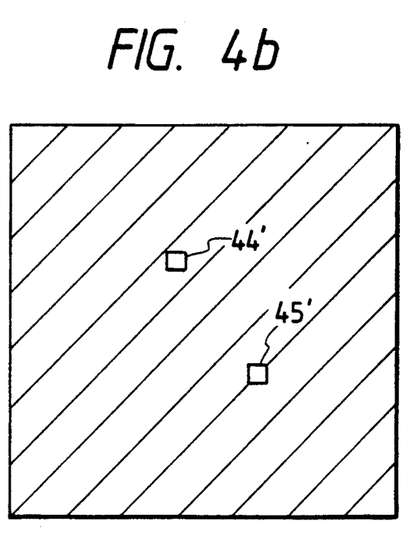

Using a reticle comprising a phase shifter 42 disposed on a glass substrate 41 as shown in FIG. 4a, a first exposure was conducted onto a wafer coated with a negative type resist. Then, a second exposure was applied by using a second reticle comprising a phase shifter 43 disposed on the glass substrate 41. Each of the first exposure and the second exposure was conducted with such an exposure amount that a predetermined portion of the resist was left sufficiently after the development. The film residual rate after the development was set to about 95% in this embodiment, but this is not restrictive. By developing the wafer, hole patterns 44' and 45' each with a diameter of 0.2 μm were Formed as shown in FIG. 4b at places on the wafer corresponding to the intersections 44 and 45 of the phase shifters 42 and 43, respectively. As an exposure system, an i-line stepper with an NA of 0.42 was used. In a case of forming holes by the usual exposing method using a Cr opaque layer by using the exposure system, the minimum diameter obtained was about 0.4 μm. According to the present invention, a hole pattern with a minimum diameter of about one-half to that in the usual case could be formed. Further, since the diameter of the hole pattern also depends on the amount of exposure, the hole diameter can be Finely controlled also by the exposure amount. It will be apparent that the shape of the hole can be controlled to a rectangular or elliptic shape by making the exposure amount different between the first exposure and the second exposure.

Although two reticles were used in this example, the positional accuracy for the hole was identical with the case of using only one reticle. Referring to the hole 44', the positional accuracy in the direction x is determined in accordance with the positional accuracy of the phase shifter 42, while the positional accuracy in the direction y is determined in accordance with the positional accuracy of the shifter 43, because the positional accuracy for the hole is determined not depending on the relative position of the two reticles but the accuracy in each of the directions is determined by the positional accuracy for each of the reticles.

Example 5

Figure 5A:
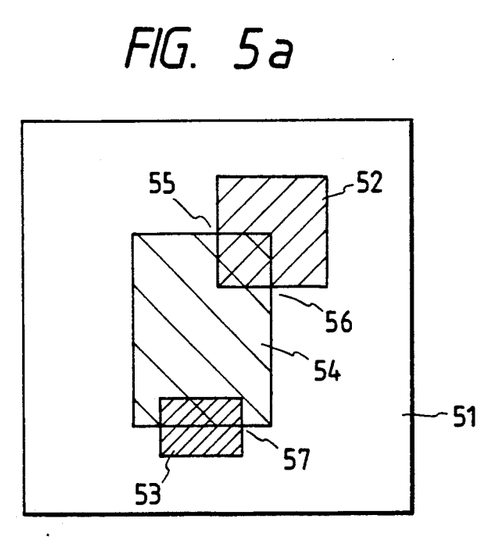
Figure 5B:
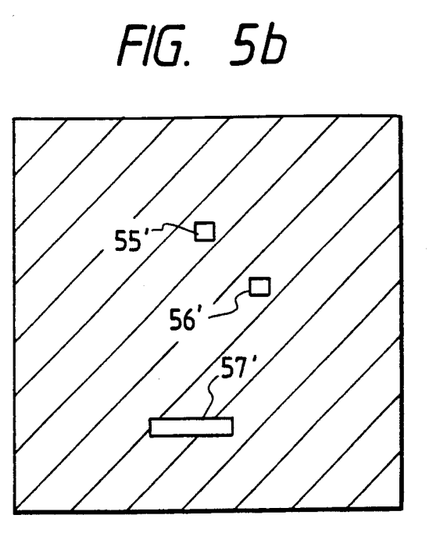

A first exposure was conducted by using a first reticle comprising a first phase shifter 52 and an opaque layer 53 made of a Cr film disposed on a glass substrate 51 as shown in FIG. 5a, instead of the two reticles used in Example 4. Then, the second exposure was applied by using a second reticle comprising a second phase shifter 54 disposed on the glass substrate 51. The first phase shifter 52 and second phase shifter 54 were so disposed that they intersected at two points 55 and 56, while the Cr opaque layer was so disposed as to surround a portion 57 on the rim of the second phase shifter 54. Then, development was applied to form hole patterns 55' and 56' at places corresponding to the two points 55 and 56 and a space pattern 57' at a place corresponding to the portion 57 as shown in FIG. 5b. The diameter of the hole pattern 55' was about 0.2 μm and the line width of the space pattern 57' was about 0.2 μm.

Example 6

Figure 6A:
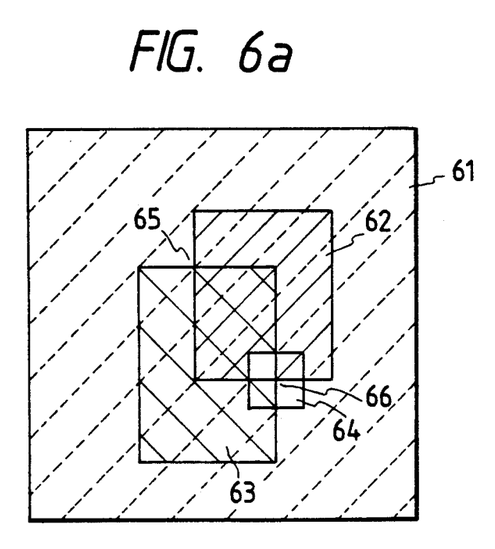
Figure 6B:
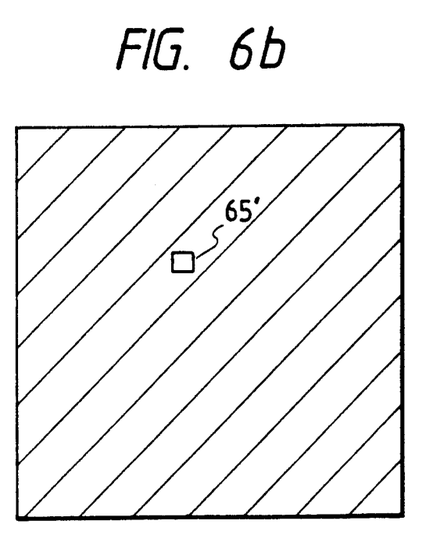

A resist pattern was formed by using three reticles instead of the two reticles used in Example 4. As shown in FIG. 6a, a first reticle comprises a phase shifter 62 disposed on a glass substrate 61, while a second reticle comprises a phase shifter 63 disposed on the glass substrate 61 respectively. In a third reticle, a Cr film having an opening 64 is formed on the glass substrate 61. Consequently, in the third reticle, the opening 64 functions as a transparent portion while the rest of the third reticle functions as a light screening portion. The two shifters 62 and 63 were so disposed that their rims intersected at two places 65, 66, while the third reticle was so disposed that one of the two places, i.e., the place 66, was situated in the opening 64. Exposure was conducted by using the three reticles respectively and then development was conducted to form a hole pattern 65' at a position corresponding to the intersection 65 as shown in FIG. 6b. In this embodiment, an extremely small hole pattern with a diameter of about 0.2 μm could be formed. On the other hand, since the place 66 was exposed by way of the opening 64, no hole pattern was formed at that position.

Example 7

Figure 7A:
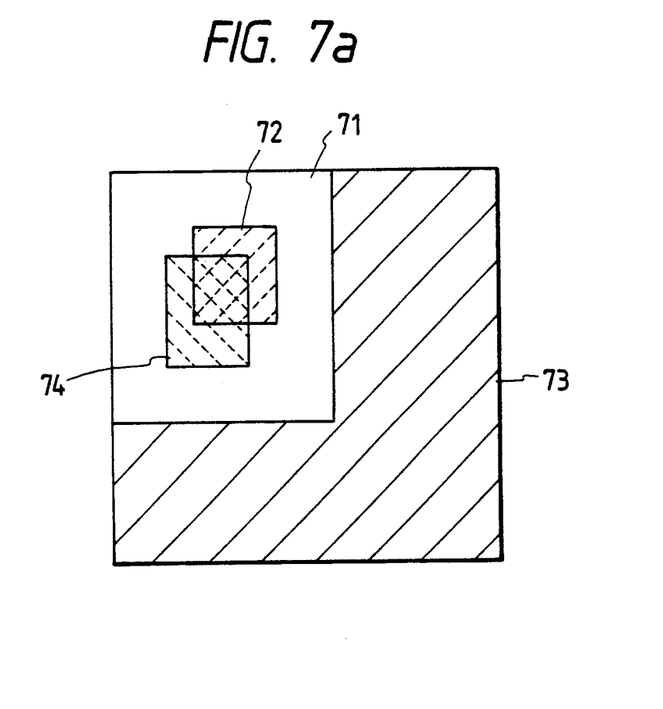
Figure 7B:
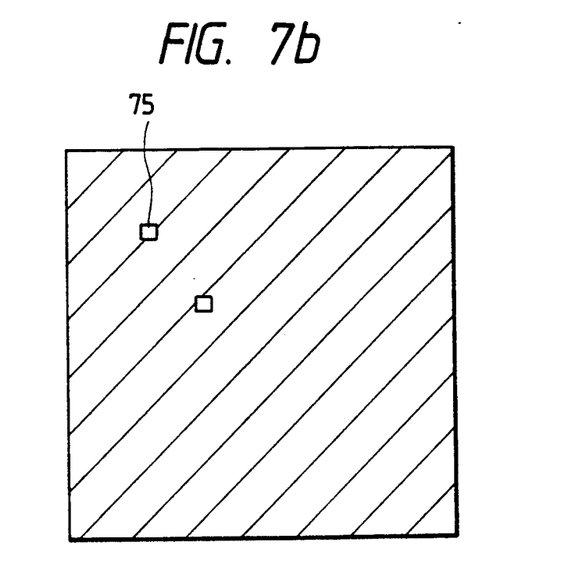

Exposure was conducted using a first reticle comprising a phase shifter 72 made of an SiO₂ film formed on a glass substrate 71 by sputtering and an opaque layer 73 made of a Cr film disposed on the glass substrate 71 and a second reticle comprising a phase shifter 74 made of an SiO₂ formed by sputtering disposed on the glass substrate 71, as shown in FIG. 7a, to form a hole-shaped resist pattern 75 as shown in FIG. 7b in the same manner as in Example 4. In this example, the two phase shifters 72 and 73 were so disposed that the rims of the two phase shifters 72 and 73 intersected at a position to form the hole pattern. Further, the opaque layer 73 was disposed in a place where no phase shifter was disposed in the first reticle and the second reticle and where the glass substrate was bare. In this example, the area of the opaque layer 73 was about ⅜ of the area of the reticle.

The effect of stray light was examined by using a reduction projection printing system mounted with a lens forming stray light for about 10% of light. As a result, the minimum pattern size was 0.3 μm in a case of using a reticle having no opaque layer and in which the glass substrate was bare, whereas the minimum pattern size was 0.25 μm in this example using the reticle having the opaque layer. Thereafter, the minimum pattern size could be reduced by using the opaque layer.

Example 8

When a large scale integrated circuit was prepared by using the method shown in Examples 1 to 6, the chip area could be reduced by about 30%. By the reduction of the area, it was possible to increase the number of chips obtainable per wafer sheet and reduce the production cost per chip. Further, it is also possible to shorten the length of wirings and the operation speed could also be improved by about 10% for the above-mentioned reasons.

Example 9

In the previous examples, an SiO₂ film, for instance, was formed on a transparent glass plate for use as a phase shifter and a phase shifter pattern.

For forming the phase shifter or the phase shifter pattern from the SiO₂ film, it is necessary to form a photoresist film on the SiO₂ film and fabricate it into a predetermined shape by using ordinary lithography. Accordingly, it is necessary to coat the SiO₂ film with the photoresist and to remove the photoresist film after fabricating it into a predetermined shape, which is somewhat complicated.

In this example, a phase shifter and a phase shifter pattern of a predetermined shape were formed directly without using the photoresist film. This could eliminate the requirement for the coating of the photoresist, and the step for removing the photoresist film after the formation of the phase shifter and the phase shifter pattern, to remarkably simplify the required steps.

In this example, as the material for forming the phase shifter or the phase shifter pattern, a negative type radiation sensitive material sensitive to various types of radiation such as an electron beam and light such as laser light was used. The material includes an acid generator and a spin on glass.

The spin on glass contains a siloxane compound having a structure represented by:

where n represents an average condensation number and $Z_1$, $Z_2$ each represents an alkyl group, an alkoxy group, an acetoxy group, a hydroxyl group, a hydrogen atom or a siloxane compound.

The spin on glass comprises a siloxane structure formed by an appropriate condensation reaction in a solution for providing the necessary coatability. Further, it is necessary for the solution to contain one or more hydroxyl groups chemically bonded with a silicon atom, that is, a silanol group per one siloxane oligomer having an average condensation number of n.

The negative radiation sensitive material forms an acid under exposure, for example, to an electron beam or ultraviolet rays. The condensation reaction is further promoted by the acid serving as a catalyst. The condensation reaction is further promoted by applying a step of promoting the reaction, for example, a step of applying heat treatment after irradiation by an electron beam, etc.

In a case where the solution contains two or more hydroxyl groups per one siloxane oligomer, two or more siloxane oligomers are bonded by means of the condensation reaction in a region exposed to the electron beam, etc., to increase the molecular weight and become less soluble to a developer, for example, an organic solvent or an alkaline solution. With the reaction described above, a negative pattern is formed after development. Since the catalytic reaction with acid is used, it is highly sensitive to radiation such as an electron beam or light.

By using the negative radiation sensitive material described above, it is possible to prepare a phase shifter and a phase shifter pattern used in phase shifting mask technology using, for example, a KrF excimer laser (248 nm in wavelength), a g-line (436 nm in the wavelength) or an i-line (365 nm in wavelength) from a high pressure mercury lamp as an optical source.

The layer thickness d of the phase shifter preferably satisfies the following relation:

$$\lambda \frac{1}{4(n-1)} \leq d \leq \lambda \frac{3}{4(n-1)} \quad (1)$$

where n represents a refractive index of the phase shifter for the wavelength λ of the exposure light. Further, the optimum value $d_1$ for the thickness of the phase shifter is given by the following equation (2):

$$d_1 \lambda/2(n-1) \quad (2)$$

A negative radiation sensitive material was prepared by dissolving 3 parts by weight of triphenylsulfonium triflate as an acid generator to 100 parts by weight of a spin on glass OCD type 7 11000T (the trade name of a product manufactured by Tokyo Oka Co., Ltd.).

In this example, although OCD type 7 11000T was used as the spin on glass, this is not restrictive, but various kinds of spin on glass can be used. Further, although triphenylsulfonium trillate was used as the acid generator, this is not restrictive but there can be used, for example, an onium salt, a sulfonium ester or a halide. There can be used, for example, diphenyl iodonium trillate, bis (t-butylphenyl)-iodonium trillate, diphenyl iodonium hexafluoro phosphate and triphenyl phosphonium hexafluoro arsinate as the onium salt, 1,2,3-tri(methanesulfonyl)oxy benzene as the sulfonium ester and tri (1,2,3-bromoproyl) isocyanurate or the like as the halide. Further, the amount of the acid generator used is not restricted only to the above, but varies depending on the kind of the acid generator. Generally, as the amount of the acid generator is increased, sensitivity to the irradiation of an electron beam or light is increased.

The negative type radiation sensitive material with the composition as described above was spin coated on a transparent synthetic quartz plate to prepare a coating layer. The layer thickness d and the optimum layer thickness $d_1$ for the phase shifter are represented respectively by the equations (1) and (2) described above.

In this example, the wavelength λ was 365 nm (the i-line) and the refractive index n was 1.5. Accordingly, the optimum layer thickness $d_1$ of the phase shifter was 365 nm but, when development and heat treatment were applied to the coating layer formed by spin coating, the layer thickness after such treatment was reduced to about 80% of the thickness of the coating layer. Accordingly, the layer thickness of the coating layer was set to 430 nm in this embodiment.

As described above, various kinds of spin on glass or acid generators may be used and those having more than 90% transmittance to light of the exposure wavelength and sufficient mechanical strength (for example, a Mohs hardness of 2 or more) after heat treatment at a predetermined temperature are preferred. Since the refractive index is determined depending on the kind of the materials used, it is apparent that the optimum thickness of the phase shifter layer given by the equation (2) is determined also by the material. Subsequently, the coating layer was applied with a heat treatment by using a hot blow convection type furnace at a temperature of 80° C. for 15 min. The conditions for the heat treatment can be changed properly.

Subsequently, a predetermined phase shifter pattern region was drawn by using an electron beam exposure system at an acceleration voltage of 30 KeV. Although the electron beam dosage was set to 20 uC/cm² in this example it may be selected properly depending on the size of the phase shifter pattern to be drawn, the kind of the spin on glass used, the kind and the concentration of the acid generator, etc. Subsequently, a heat treatment was applied at 80° C. for 5 min for promoting the condensation reaction. Although OCD type 7 was used as the spin on glass in this example, since the condensation reaction promoted by heating also proceeds in addition to the catalytic reaction when the heat treatment is applied at a temperature higher than 150° C., it is preferred to set the temperature for the heat treatment to lower than about 150° C. On the other hand, since the condensation reaction proceeds even at a temperature lower than about 150° C., it is preferable not to apply the heat treatment for a time longer than about 20 min. The optimum conditions for the heat treatment varies, for example, depending on the drawing conditions, etc.

Then, after dipping the coating layer in methanol for 30 sec for development, it was dried to form a phase shifter.

Although spin on glass was used as a silicon compound in this example, the durability of the phase shifter formed is not so high. In view of the above, for improving the durability of the phase shifter, a heat treatment was applied at a temperature of 200° C. for 30 min after the development to vitrify the phase shifter. In this case, the phase shifter can be vitrified by a heat treatment at a temperature higher than about 150° C., preferably, at a temperature from about 200° C. to 350° C.

If it is necessary to further improve the durability of the phase shifter, a second heat treatment is further applied for densification, for example, at a temperature of about 450° C. for about 30 min. With such a treatment, the durability of the phase shifter is remarkably improved. However, since cracks may occur in the phase shifter if the temperature of the heat treatment is higher than about 500° C., a temperature which is not to high is preferred. The conditions for the heat treatment can of course vary depending, for example, on the kind of the material. As has been described above, a phase shifter and a phase shifter pattern each having a desired shape have thus been formed. When the layer thickness of the phase shifter formed as described above was measured by using a film thickness measurement system, a desired value of 365±10 nm could be obtained within the mask pattern area. Further, when a wiring pattern for a 64 MDRAM with a minimum size of 0.3 μm was transferred by using the phase shift mask formed in this example and using an i-line reduction projection printing system with a 10:1 reduction rate having a projection optical system with an NA=0.42, a pattern with satisfactory resolution could be transferred.

The exposure wavelength used is not restricted only to an i-line, but a g-line (436 nm in wavelength), a KrF excimer laser beam (248 nm in wavelength), etc. may also be used. In this case, the conditions, for example, For the layer thickness of the phase shifter may be changed properly relative to the wavelength of the exposure light.

When the mask for the phase shifting mask technology formed in this example was inspected by using a mask inspection system, no defects in the phase shifter pattern were detected but a residue of the phase shifter layer was detected at a portion on the periphery of the phase shifter. The ingredients of the residue were substantially the same as those of the phase shifter pattern and the amount was extremely small giving no undesired effect at all on the actual process.

Further, in measuring the layer thickness of the phase shifter pattern, the thickness was sometimes found to reach 395±5 nm. Since the optimum layer thickness of the phase shifter is 365 nm as described above, the above mentioned value is greater by more than about 30 nm. In view of the above, for eliminating the residue thereby attaining the optimum layer thickness for the phase shifter, the phase shifter layer was selectively etched by using an etching solution prepared by diluting a fluoric acid (at 50% concentration) by 300 times with ammonium fluoride (at 50% concentration). In this case, since the etching rate of the phase shifter layer relative to the etching solution described above was about 1 nm/sec, the layer thickness was reduced by about 30 nm with the etching time being 30 sec. In addition to the etching method described above, a dry etching method using a gas such as $CF_4$ may also be used. An anisotropic etching method is preferably used in order to suppress fluctuation of the pattern size. In addition, a step of removing the residue may be applied after development and before heat treatment.

When the phase shift mask whose layer thickness was controlled to a predetermined thickness by etching in this way was inspected by using a film thickness measurement system, no defects were recognized in the phase shifter pattern, and thus a satisfactory mask was obtained. Further, when the film thickness of the phase shifter pattern formed was measured by using the film thickness measuring system, a desired value of 365±10 nm was obtained within the mask pattern region. Further, after cleaning for 100 times with a mask cleaning system, the mask was inspected again but no abnormality was found at all in the phase shifter pattern, and thus it was confirmed that the mask was extremely durable.

The negative type radiation sensitive material used in the above example is highly sensitive to light or a electron beam, and therefore a fine pattern can be formed directly at a high accuracy without using a photoresist film. Further, since the material is also extremely durable, it can be used not only in the present invention but also in the usual phase shifting mask technology applied by the combined use of the phase shifter and an opaque layer, for example, made of a Cr film, to obtain an extremely desirable result. Further, it can be used as a photoresist film which is the uppermost layer in the well-known three-layer resist process. Since the negative type radiation sensitive material used in this example contains silicon, it is highly resistant to etching and, accordingly, the use of an intermediate film acting as a mask for the etching of the lowermost layer in the three-layer resist process can be saved, remarkably simplifying the three-layer resist process.

As has been described above, according to the present invention, fine line patterns or space patterns of different widths can be formed by phase shifting mask technology and, further, a fine hole pattern or dot pattern having a desired size can be formed by phase shifting mask technology.

This enables the preparation of a ULSI for which a further finer pattern than usual is required and it is also extremely effective for the improvement of characteristics of a ULSI and the reduction of chip area. Furthermore, in the case of forming the phase shifter or the phase shifter pattern with the negative type radiation sensitive material shown in Example 9, the use of the photoresist pattern is no longer required, thus remarkably simplifying the steps, as well as the life of the phase shifter or the phase shifter pattern is increased much longer than that in the usual case, which is effective for the reduction of cost. As the light used for the exposure, there can be used, for example, an i-line (360 nm in wavelength) or a g-line (436 nm in wavelength) from a mercury lamp, or a KrF excimer laser (248 nm in wavelength).

What is claimed is:

1. A method of forming a pattern by irradiating light through a reticle onto a photoresist film via a reduction projection printing system to form a predetermined pattern on said photoresist film, wherein said reticle comprises an optically transparent plate, a phase shifter, and a phase shifter pattern, the phase shifter and the phase shifter pattern each having a predetermined shape and being disposed on said plate, said phase shifter and said phase shifter pattern being formed from a single transparent film disposed on said plate such that a material of which said phase shifter is made is the same as a material of which said phase shifter pattern is made and a thickness of said phase shifter is the same as a thickness of said phase shifter pattern, the phase of light after passing through a bare portion of said plate on which said phase shifter or said phase shifter pattern is not disposed and the phase of light after passing through said phase shifter or said phase shifter pattern being different from each other by 180°±10°, and wherein the size of the phase shifter pattern is less than the resolution of said reduction projection printing system.

2. A method of forming a pattern as defined in claim 1, wherein the phase shifter is a comb-like pattern formed on an edge of the phase shifter, and the predetermined pattern formed on the photoresist film is a line pattern or a space pattern.

3. A method of forming a pattern as defined in claim 2, wherein the comb-like pattern has protrusions and the width of each of the protrusions and the distance between adjacent ones of the protrusions are each less than the resolution of the reduction projection printing system.

4. A method of forming a pattern as defined in claim 1, wherein the phase shifter pattern comprises a plurality of dot-like patterns disposed near an edge of the phase shifter, and the predetermined pattern formed on the photoresist film is a line pattern or a shape pattern.

5. A method of forming a pattern as defined in claim 4, wherein the size of each of the dot-like patterns and the distance between adjacent ones of the dot-like patterns are each less than the resolution of the reduction projection printing system.

6. A method of forming a pattern as defined in claim 1, wherein the phase shifter and the phase shifter pattern each comprise a silicon dioxide film, a spin on glass film, an oxide film made of indium and tin, a silicon nitride film, or a polyamide film.

7. A method of forming a pattern as defined in claim 1, wherein the light is an i-line or a g-line from a mercury lamp or a KrF laser beam.

8. A method of forming a pattern as defined in claim 1, wherein the step of irradiating light comprises a first step of irradiating light through a first reticle and a second step of irradiating light through a second reticle, each of said first and second reticles comprising an optically transparent plate, a phase shifter, and a phase shifter pattern, and wherein said first and second reticles are disposed such that the phase shifter pattern of said first reticle and the phase shifter pattern of said second reticle intersect each other, thereby forming a hole pattern or a dot pattern on the photoresist film at a position corresponding to a position at which said phase shifter pattern of said first reticle and said phase shifter pattern of said second reticle intersect each other.

9. A method of forming a pattern as defined in claim 8, wherein, with respect to each of the first and second reticles, the phase shifter pattern is a comb-lie pattern formed on an edge of the phase shifter.

10. A method of forming a pattern as defined in claim 9, wherein the comb-like pattern has protrusions and the width of each of the protrusions and the distance between adjacent ones of the protrusions are each less than the resolution of the reduction projection printing system.

11. A method of forming a pattern as defined in claim 8, wherein, with respect to each of the first and second reticles, the phase shifter pattern comprises a plurality of dot-like patterns disposed near an edge of the phase shifter.

12. A method of forming a pattern as defined in claim 11, wherein the size of each of the dot-like patterns and the distance between adjacent ones of the dot-like patterns are each less than the resolution of the reduction projection printing system.

13. A method of forming a pattern by irradiating light through a reticle onto a photoresist film via a reduction projection printing system to from a predetermined pattern on said photoresist film, wherein said reticle comprises an optically transparent plate, a phase shifter, and a phase shifter pattern, the phase shifter and the phase shifter pattern each having a predetermined shape and being disposed on said plate, a material of which said phase shifter is made being the same as a material of which said phase shifter pattern is made and a thickness of said phase shifter being the same as a thickness of said phase shifter pattern, the phase of light after passing through a bare portion of said plate on which said phase shifter or said phase shifter pattern is not disposed and the phase of light after passing through said phase shifter or said phase shifter pattern being different from each other by 180°±10°, and wherein the size of the phase shifter pattern is less than the resolution of said reduction projection printing system;

wherein the phase shifter and the phase shifter pattern are each formed from a coating layer formed by coating the plate with a spin on glass containing an acid generator and a residual silanol group.

14. A method of forming a pattern as defined in claim 13, wherein the phase shifter and the phase shifter pattern are each formed by exposing a predetermined portion of the coating layer to an electron beam and developing the exposed coating layer.

15. A method of forming a pattern as defined in claim 14, wherein the phase shifter and the phase shifter pattern are heat treated after development of the exposed coating layer.

16. A method of forming a pattern as defined in claim 13, wherein the acid generator is selected from the group consisting of triphenylsulfonium triflate, diphenyliodonium triflate, bis(t-butylphenyl)iodonium triflate,

* * * * *